United States Patent [19]

Etoh et al.

[11] Patent Number: 4,503,522
[45] Date of Patent: Mar. 5, 1985

[54] DYNAMIC TYPE SEMICONDUCTOR MONOLITHIC MEMORY

[75] Inventors: Jun Etoh; Yoshiki Kawajiri, both of Hachioji; Ryoichi Hori, Tokyo; Kiyoo Itoh, Higashikurume, all of Japan

[73] Assignee: Hitachi, Ltd., Tokyo, Japan

[21] Appl. No.: 358,678

[22] Filed: Mar. 16, 1982

[30] Foreign Application Priority Data

Mar. 17, 1981 [JP] Japan ............................. 56-37706[U]
Apr. 17, 1981 [JP] Japan ................................. 56-57142

[51] Int. Cl.³ ........................ G11C 7/00; G11C 11/40
[52] U.S. Cl. .................................... 365/203; 365/204; 365/189
[58] Field of Search ............... 365/189, 203, 230, 231, 365/174, 182, 183, 204; 307/449, 463

[56] References Cited

U.S. PATENT DOCUMENTS 4,078,261 3/1978 Millhollan et al. ................. 365/189
4,112,508 9/1978 Ithoh ............................. 365/205 X
4,404,661 9/1983 Nagayama et al. ............. 365/204 X Primary Examiner—Robert L. Richardson
Attorney, Agent, or Firm—Antonelli, Terry & Wands

[57] ABSTRACT

A dynamic type semiconductor memory using MOS transistors, in which first and second booster circuits utilizing capacitances, respectively, are provided at each of stages preceding and succeeding to a word driver, respectively. Data lines of the memory are each provided with a voltage compensating circuit for increasing a voltage for charging a memory cell to a level higher than a source voltage for being rewritten in the memory cell. A first boosting circuit is operated after a word line driving pulse signal is produced. Subsequently, word driver selecting transistors are turned off, which is followed by operation of the second booster circuit. Thus, the word line voltage is boosted twice.

27 Claims, 8 Drawing Figures

DYNAMIC TYPE SEMICONDUCTOR MONOLITHIC MEMORY

The present invention relates to a dynamic type semiconductor memory in which use is made of the presence and absence of charges stored in storage capacitances.

In a dynamic type semiconductor memory constituted by insulated gate field effect transistors represented by MOS transistors, storage of charge in storage capacitances is effected commonly through a transistor controlled by a word line. Accordingly, when the level of a write-in signal is the same as the control signal level of the word line, the level of charge voltage at the storage capacitance is lowered by a magnitude corresponding to a threshold value of the transistor. To deal with this problem, there is disclosed in Japanese patent application Laid-Open No. 61429/1979 a semiconductor memory in which the word line driving pulse signal is boosted by making use of capacitance to a control level of the word line which is higher than a source voltage, to thereby realize the charging of the storage capacitance without any appreciable loss.

In order for the dynamic semiconductor memory to be realized with a higher integration density, the power source voltage ($V_{cc}$) has to be correspondingly lowered in consideration of the voltage withstanding capability of transistors incorporated in such memory. However, for attaining an adequate S/N ratio and/or reducing soft errors due to $\alpha$-particles, it is required that storage charges of a sufficiently large magnitude be stored in the storage capacitors. In this connection, it is however noted that, in the case of the memory mentioned above, the voltage of the word line is practically limited to about 1.5 $V_{cc}$, involving difficulty in increasing the charge voltage of the storage capacitance beyond the source voltage ($V_{cc}$).

An object of the present invention is to provide a dynamic type semiconductor memory in which the charge voltage for charging storage capacitances of the memory can be increased beyond a power source voltage.

Another object of the present invention is to provide a dynamic type semiconductor memory which is suited for being implemented in a monolithic memory of an increased integration density, which enjoys a high signal-to-noise (S/N) ratio and in which the possibility of soft errors can be significantly reduced.

According to a general feature of the invention, while the word line is driven by boosting the voltage thereof twice or more, the charging voltage for the associated memory cells are boosted to a voltage level higher than the source voltage.

FIG. 1 shows a general arrangement of a monolithic memory according to an exemplary embodiment of the present invention.

Incoming external address signals $A_o, \ldots, A_n$ are supplied to an address buffer 10 at its inputs $A_o, \ldots, A_n$. A column address strobe signal $\overline{CAS}$ indicating that these address signals are for column addresses is supplied to a timing control circuit 32 which is also supplied with a row address strobe signal $\overline{RAS}$ indicating that the address signals concern the row addresses. A data input signal $D_{in}$ and a write enable signal $\overline{W}_e$ are coupled to an input/output or I/O control circuit 30. Data output signal $D_{out}$ from this monolithic memory is obtained also through the I/O control circuit 30.

Figure 4:
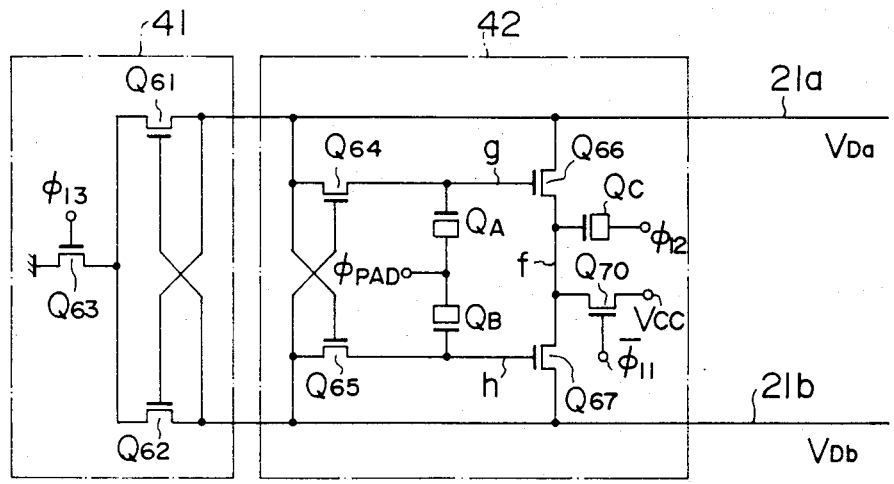
FIG. 4 shows a circuit diagram illustrating a circuit configuration of the circuit represented by a block 24 in FIG. 1.

Internal address signals obtained from the address buffer 10 are coupled to a row decoder 12, a column decoder incorporated in a circuit block 26 and others by way of internal address lines 11. A plurality of word lines 23 extend from a word driver 13. There are disposed memory cells 22 at crossovers at which the word lines 23 intersect data lines 21, respectively, whereby a memory array generally denoted by a reference numeral 20 is implemented. Connected to these word lines 23 are a booster circuit 28 and a word latch circuit 14. On the other hand, connected to the data lines 21 are a circuit block 24 composed of a sense amplifier and a voltage compensating circuit (e.g. see FIG. 4) as well as the circuit block 26 including the row decoder, two pairs of common input/output (I/O) lines and others.

In the case of the embodiment being described, another memory array 20' is disposed symmetrically to the memory array 20 with the circuit block 26 being interposed therebetween. There are provided in association with the second memory array 20' a booster circuit 28', a word latch circuit 14', a word driver 13', a row decoder 12' and a circuit block 24' composed of a sense amplifier and a voltage compensating circuit in a manner similar to those associated with the first memory array 20.

The timing control circuit 32 issues control pulse signals to the individual circuits. Among them, a pulse signal $\phi_x$ for driving the word lines 23 is applied to a pulse distributor circuit 16. The amplitude of the signal $\phi_x$ is equal to a power source voltage $V_{cc}$ supplied from outside of the memory. However, the amplitude may be smaller than the voltage $V_{cc}$. The pulse distributor circuit 16 is adapted to select one of four pulse signal lines 17 which extend to the word drivers 13 and 13' by way of a booster circuit 18 and output the pulse signal $\phi_x$ onto the selected one of the four pulse signal lines 17. Further, since one of the plural word drivers is selected by the row decoders 12 and 12', respectively, only one of the plural word lines is selected to be driven for each memory array.

Figure 1:
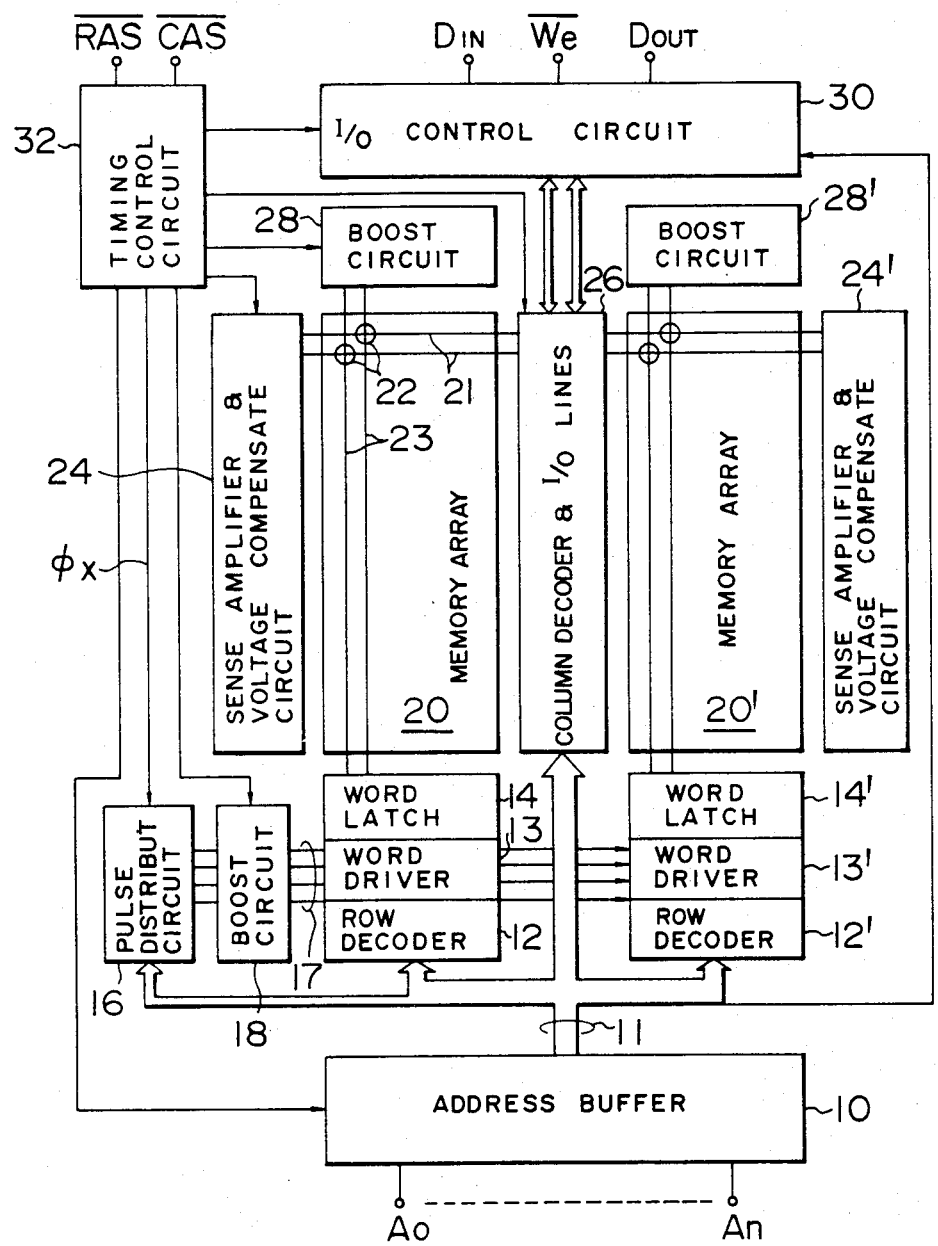
FIG. 1 shows in a block diagram a general arrangement of a dynamic type semiconductor memory according to an exemplary embodiment of the invention.
Figure 2:
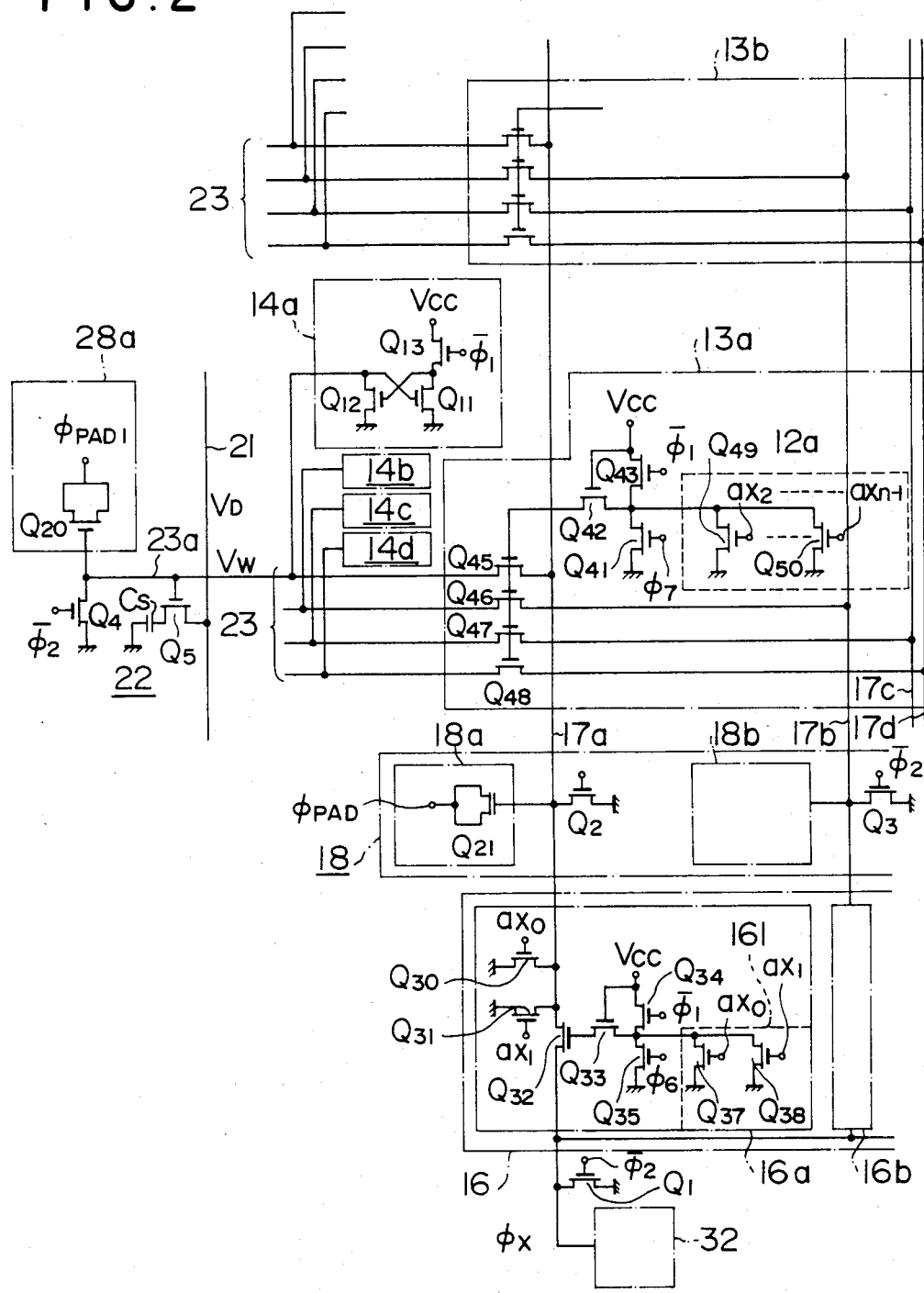
FIG. 2 shows a circuit diagram of a major circuit portion of the memory circuit shown in FIG. 1.

FIG. 2 shows in detail a main portion of the memory arrangement shown in FIG. 1. Referring to the figure, the pulse distributor 16 is composed of four pulse signal ($\phi_{xij}$) generating circuits (hereinafter referred to as $\phi_{xij}$-generator). The $\phi_{xij}$-generator 16a is connected to the pulse signal line 17a, while the $\phi_{xij}$-generator 16b is connected to the pulse signal line 17b. Although not shown in FIG. 2, the two other $\phi_{xij}$-generators are connected to the pulse signal lines 17c and 17d, respectively. These pulse signal lines 17a to 17d are connected, respectively, to word drivers 13a, 13b and so forth which are provided each for the four word lines 23. It is noted that only two of the word drivers are shown in FIG. 2 and denoted by 13a and 13b, respectively. Booster circuits 18a, 18b and so forth are connected, respectively, to the individual signal lines 17a, 17b, 17c and 17d. Further, the word latch circuits 14a, 14b, 14c and 14d as well as the booster circuits are connected, respectively, to the individual word lines 23.

The word latch circuits, one of which is shown in detail in the block 14a in FIG. 2 as representative, are provided to serve for minimizing variation in voltage on the word lines 23. When the memory is in the standby state, a signal $\phi_1$ is at the level of a source voltage $V_{cc}$, whereby a gate of a MOS transistor $Q_{12}$ is charged by way of a MOS transistor $Q_{13}$, resulting in that an associated word line 23a is grounded through the MOS transistor $Q_{12}$. Subsequently, the memory is set to the state ready for operation. When the word line 23a connected to the word latch 14a is selected, involving a rise-up in voltage $V_w$ on the word line 23a, the gate potential of a MOS transistor $Q_{11}$ is increased, whereby the gate potential of the MOS transistor $Q_{12}$ is set to the ground level through the MOS transistor $Q_{11}$. As the consequence, the MOS transistor $Q_{12}$ is turned off, to thereby cause the voltage $V_w$ on the word line 23a to be increased. Unless the word line 23a is selected, the word line remains in the state grounded through the MOS transistor $Q_{12}$. In this manner, variation in voltage on the word line 23a is suppressed. The same holds true to the other word latch circuit 14b, 14c and 14d and the associated word lines 23.

Each of the memory cells 22 is composed of a MOS transistor $Q_5$ having a gate electrode connected to the associated one of the word lines 23 and a capacitance $C_s$ formed at a region adjacent to this MOS transistor $Q_5$.

In the $\phi_{xij}$-generator circuit 16a, a circuit portion indicated as enclosed by a broken line block 161 constitutes a part of the column decoder 12a shown as incorporated in the word driver 13a. Internal address signals $ax_0$ and $ax_1$ are applied to gate electrodes of MOS transistors $Q_{37}$ and $Q_{38}$, respectively. Corresponding circuit portions of the three other $\phi_{xij}$-generator circuits 16b, 16c and 16d are supplied with either the internal address signal $ax_0$ or a complementary signal $\overline{ax_0}$ thereof and either the internal address signal $ax_1$ or a complementary signal $\overline{ax_1}$ thereof in different combinations. Thus, one of the $\phi_{xij}$-generator circuits 16a, 16b, 16c and 16d can be selected through designation by the corresponding address signal combination of two bits. On the other hand, the internal address signals $ax_2, \ldots, ax_{n-1}$ are applied to gate electrodes of MOS transistors $Q_{49}, \ldots, Q_{50}$, respectively, of the row decoder 12a connected to the word driver 13a. The other column decoders connected to the other word drivers (not shown) can be supplied with different combinations of the internal address signals $ax_2, \ldots, ax_{n-1}$ and complementary signals $\overline{ax_2}, \ldots, \overline{ax_{n-1}}$, respectively. In this manner, only one of the word drivers 13 can be selected under designation by the corresponding combination of the internal address signal and the complementary signal thereof.

Figure 3:
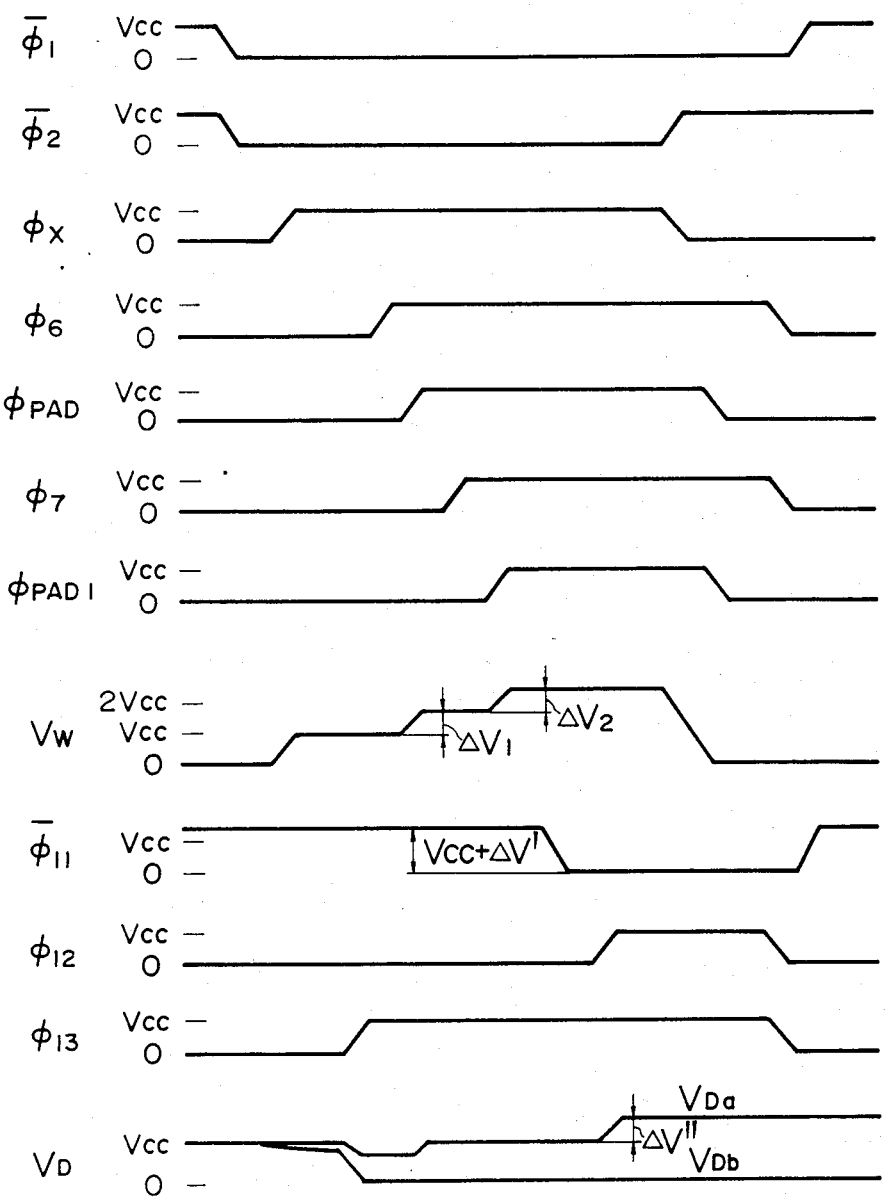
FIG. 3 shows a timing chart for illustrating operations of the circuits shown in FIGS. 1 and 2.

Next, the read-out operation of the memory shown in FIGS. 1 and 2 will be described in detail by referring to signal waveform diagrams illustrated in FIG. 3. First of all, voltages at circuit nodes are set by signals $\phi_1$ and $\phi_2$, which are at $V_{cc}$ and subsequently fall down to a low level (0 volt). At this time, the data lines 21 are precharged by precharge means (not shown), so that the voltage $V_D$ of the data lines 21 remain at the source voltage $V_{cc}$. It should be noted that the precharged voltage level of the data lines 21 may be lower than the source voltage $V_{cc}$, and this level is variable depending upon the circuit constructions of the precharge means. Subsequently, the internal address signals and the corresponding complementary signals are supplied to the column decoders 12 and the pulse distributor circuit 16. For the convenience of description, it is assumed that the internal address signals $ax_0, ax_1, ax_2, \ldots, ax_{n-1}$ are all at the low level and thus the word driver 13a is selected by the row decoder 12a, and that the $\phi_{xij}$-generator circuit 16a is selected in the pulse distributor circuit 16.

In the first place, since the internal address signals $ax_2, \ldots, ax_{n-1}$ are at low level in the column decoder 12a, the gates of the MOS transistors $Q_{45}, Q_{46}, Q_{47}$ and $Q_{48}$ are maintained at a potential $(V_{cc}-V_T)$ precharged by the signal $\phi_1$ where $V_T$ represents a threshold voltage of the MOS transistors, even after the address signals have been inputted. On the other hand, potentials at source electrodes and drain electrodes of these transistors are set at low level in response to the signal $\phi_2$ through the MOS transistors $Q_2, Q_3, Q_4$, etc. As the consequence, the MOS transistors $Q_{45}, Q_{46}, Q_{47}$ and $Q_{48}$ are in the conducting state.

The $\phi_{xij}$-generator circuit 16a is first precharged with the signal $\phi_1$, resulting in that the gate electrode of the MOS transistor $Q_{32}$ is set at the potential level represented by $(V_{cc}-V_T)$. Even when the address signal $ax_0$ and $ax_1$ are inputted, the electric charge precharged will not be discharged because of the assumption that both the address signals $ax_0$ and $ax_1$ are at low level (zero volts), whereby the gate electrode of the MOS transistor $Q_{32}$ remains at the potential level of $(V_{cc}-V_T)$. On the other hand, the potentials on the source and the drain electrodes of this transistor $Q_{32}$ are cleared to the low level (zero volts) in response to the signal $\phi_2$ by way of MOS transistors $Q_1$ and $Q_2$. As a consequence, the MOS transistor $Q_{32}$ is also in the conducting state.

When the $\phi_{xij}$-generator circuit 16a is not to be selected, one or both of the address signals $ax_0$ and $ax_1$ are at high level (i.e. at $V_{cc}$) whereby the precharged gate potential of the MOS transistor $Q_{32}$ is reset to low level (zero volts). As a consequence, the MOS transistor $Q_{32}$ is set to the off or non-conducting state. In this connection, it should be noted that MOS transistors $Q_{30}$ and $Q_{31}$ connected to the output terminals of this circuit 16a causes these output terminals to be connected to the ground potential (zero volts) to inhibit generation of the output signal, because one or both of the address signals $ax_0$ and $ax_1$ applied to the gate electrodes of these transistors $Q_{30}$ and $Q_{31}$ are at high level $(V_{cc})$, when the $\phi_{xij}$-generator circuit 16a is not to be selected.

Now, let's proceed with description of the operation on the above assumption that the word driver 13a and the $\phi_{xij}$-generator circuit 16a are selected. When the MOS transistors $Q_{45}, Q_{46}, Q_{47}, Q_{48}$ and $Q_{32}$ remain in the conducting state after the address signals have been inputted, the pulse signal $\phi_x$ for driving the word lines 23 is then generated, whereby the input potential level to the pulse distributor circuit 16 is changed over from 0 (zero) to $V_{cc}$. At that time, the potential or the pulse signal line 17a selected is varied to be substantially equal to $V_{cc}$, while the potentials on the other pulse signal lines 17b, 17c and 17d remain invariably at low level. Additionally, the potential $V_w$ on the word line 23a connected to the MOS transistor Q45 is varied to the level $V_{cc}$, because this transistor Q45 is also in the conducting state. The other word lines remain at the low potential level. At that time, the gate potential of the MOS transistor Q32 rises up from the level of $(V_{cc}-V_T)$ through bootstrap operation due to capacitance of this transistor Q32, resulting in that the MOS transistor Q32 goes into unsaturated state, while the MOS transistor Q33 is turned off. As a consequence, the gate electrode of the MOS transistor Q32 is isolated from the circuit block 161. When this occurs, capacitance of the gate of the MOS transistor Q32 formed relative to the ground becomes decreased, to promote the bootstrap operation mentioned above. In this way, the MOS transistor Q33 is effective not only for aiding the bootstrap operation of the MOS transistor Q32 but also reducing voltage loss in this transistor Q32. The same holds true for the MOS transistor Q42 of the word driver 13a. Namely, this transistor Q42 also serves to promote the bootstrap operation of the MOS transistor Q45 or MOS transistors Q46, Q47, Q48 etc. and decrease voltage loss in these transistors.

When the signal $\phi_x$ is transmitted to the word line 23, a signal $\phi_6$ rises up to the level $V_{cc}$, resulting in that the MOS transistor Q35 of the $\phi_{xij}$-generator circuit 16a is turned on to thereby cause the charge at the gate electrode of the MOS transistor Q32 to be discharged. The MOS transistor Q32 is thus turned off. Subsequently, a signal $\phi_{pad}$ takes the level of $V_{cc}$ and is applied to the booster circuits 18a, 18b and so forth. Each of these booster circuits is realized by a so-called MOS capacitor which directly couples the source and the drain electrode of the associated MOS transistor. More specifically, in the case of the booster circuit 18a connected to the pulse signal line 17a, there is formed below the gate electrode of the MOS transistor Q21 an inversion layer providing a capacitance, when the gate electrode of the MOS transistor Q21 is at the potential of the pulse signal line 17a, i.e. at the level of $V_{cc}$. When the signal $\phi_{pad}$ is subsequently varied from 0 (zero volts) to $V_{cc}$, the voltage on the pulse signal line 17a and hence at the word line connected thereto is boosted from the level $V_{cc}$ to the level of $(V_{cc}+\Delta V_1)$ through the capacitance mentioned above. $\Delta V_1$ denotes a first step-up voltage. The value of $\Delta V_1$ is determined by the ratio of the capacitance of the MOS transistor Q21 to the sum of the capacitances of the pulse signal line 17a and the word line 23a with respect to a common potential line or a ground line. On the other hand, in the case of the booster circuit 18b connected to the non-selected pulse signal line 17b, the gate potential of the MOS capacitor is zero volts, whereby substantially no effective booster capacitance is available. Thus, the potential on the pulse signal line 17b remains substantially invariable even upon application of the signal $\phi_{pad}$.

After the voltage or potential $V_w$ of the word line 23a selected by the signal $\phi_{pad}$ has been boosted, a signal $\phi_7$ rises up to the level of $V_{cc}$, which signal $\phi_7$ is applied to the MOS transistor Q41 of the word driver 13a, whereupon the gates of the MOS transistors Q45, Q46, Q47 and Q48 are changed to the ground potential level. Thus, these MOS transistors Q45, Q46, Q47 and Q48 are turned off. Thereafter, a signal $\phi_{pad1}$ rises up to the level $V_{cc}$. This signal $\phi_{pad1}$ is applied to the booster circuit 28a to thereby boost the voltage at the associated word line. This booster circuit 28a is realized by the MOS transistor Q20 having the source and drain electrodes coupled directly and is operative in the same manner as in the case of the booster circuit 18a. As consequence, the voltage $V_w$ of the selected word line 23a is further boosted by $\Delta V_2$ from the level of $(V_{cc}+\Delta V_1)$. $\Delta V_2$ denotes a second step-up voltage. The value of $\Delta V_2$ is determined by the ratio of the capacitance of MOS transistor Q20 to the capacitance of the word line 23a with respect to the common potential line or the ground line. It should be mentioned that the booster circuit similar to the circuit 28a is connected to each of the word lines. However, since these booster circuits are operated through the respective MOS capacitors which become effective due to formation of the inversion layer only when the booster circuits are connected to the selected word lines, the non-selected word lines remain at the low level.

During a period in which one of the word lines 23 is driven as the result of the operation described above, the sense amplifier included in the circuit block 24 shown in FIG. 1 is operated, which is followed by operation of the voltage compensating circuit, whereby data is read out through the associated data line 21. In this connection it is to be noted that the sense amplifier and the voltage compensating circuit are provided each for the two data lines. In the following, the circuit arrangement of the circuit block 24 will be described by referring to FIGS. 3 and 4.

When one of the word lines 23 is driven by the signal $\phi_x$, data is stored in the memory cell 22 located at only one of the two crossovers or intersections between the energized word line 23a and the data lines 21a and 21b. In other words, the potential of the data line pre-charged to the potential of $V_{cc}$ undergoes a small variation in dependence on the magnitude of the charge stored in the capacitance of the memory cell mentioned above. On the other hand, a dummy cell (not shown) is connected to the data line corresponding to the crossover or intersection where the memory cell is absent. Thus, the potential of this data line also undergoes variations. Subsequently, operation of the sense amplifier 41 is triggered by a signal $\phi_{13}$, resulting in that the potential difference between the data lines 21a and 21b is subjected to differential amplification. Thus, the signal $\phi_{13}$ becomes high to thereby turn on a MOS transistor Q63. As a result, potentials on the data lines 21a and 21b are slightly varied. This variation in potential is amplified by MOS transistors Q61 and Q62 connected in cross connection, resulting in that one of the data lines which has been at lower potential than the other is discharged substantially to zero volts. At the same time, the voltage on the data line of higher potential is lowered in some degree. The voltage compensating circuit 42 then serves to increase the lowered voltage to a sufficiently high potential level. More particularly, when the data lines 21a and 21b are pre-charged to the level of $V_{cc}$, nodes g and h are also pre-charged to a voltage $(V_{cc}-V_T)$. By way of example, assuming that, upon driving the word line, the potential on the data line 21a becomes higher than that of the data line 21b, the data line 21b is discharged to zero volts due to operation of the sense amplifier 41 described above, whereby the MOS transistor Q65 is turned on, causing the node h to be also discharged to zero volts. On the other hand, although the potential $V_{Da}$ on the data line 21a is lowered slightly from the level $V_{cc}$, the MOS transistor Q64 nevertheless remains in the conducting state. Thus, the node g is maintained at the pre-charged potential of ($V_{cc}-V_T$). Potential at source and drain terminals of MOS capacitors $Q_A$ and $Q_B$ is then changed from zero volts to the level $V_{cc}$ in response to the pulse signal $\phi_{pad}$. At that time point, an inversion layer has been formed in the MOS capacitor $Q_A$. Accordingly, through the bootstrap operation, the potential at the node g is boosted to a level higher than the potential $V_{cc}$. As the consequence, the MOS transistor $Q_{66}$ is turned on, whereby the voltage $V_{Dd}$ on the data line 21a is restored to the level $V_{cc}$. On the other hand, the MOS capacitor $Q_B$ whose gate potential is zero volts does not effectively function as the capacitance. Consequently, potentials at the node h and the data line 21b remain invariable independent of application of the pulse signal $\phi_{pad}$. Subsequently, the level of a signal $\phi_{11}$ is lowered to zero volts from the level of ($V_{cc}+\Delta V'$), resulting in that a MOS transistor $Q_{70}$ is turned off. Subsequently, a signal $\phi_{12}$ rises up from zero volts to the level $V_{cc}$. At that time, the potential at the node f is boosted due to the bootstrap operation by a MOS capacitor $Q_c$, whereby the voltage $V_{Da}$ on the data line 21b is caused to increase from the level $V_{cc}$ to a potential ($V_{cc}+\Delta V''$) through the MOS transistor $Q_{66}$. Meanwhile, the MOS transistor $Q_{67}$ is in the non-conducting state with a voltage $V_{Db}$ on the data line 21b remaining unchanged. In the voltage compensating circuit 42 of the performance described above, a circuit portion serving for application of the source voltage through the MOS transistor $Q_{70}$ can be spared. In that case, the bootstrap operation of the MOS capacitor $Q_c$ is initiated starting from the level ($V_{cc}-2V_T$) pre-charged at the node f. As a consequence, the voltage on the data line after the boosting is slightly lower than the level ($V_{cc}+V''$).

Operations described above are also illustrated in FIG. 3. In the case of the example illustrated in FIG. 3, the voltage $V_w$ on the word line is not yet boosted from the voltage level $V_{cc}$ at the time point when a signal $\phi_{13}$ for driving the sense amplifier 41 rises up. When arrangement is made such that the signal $\phi_{13}$ rises up in succession to the boosting of the word line voltage $V_w$, the signal read out onto the data line can have an increased amplitude, which is advantageous in that probability of the sense amplifier being erroneously operated can be reduced.

In the exemplary embodiment of the memory device described so far, all the memory cells in which high level is stored among those associated with the driven word lines undergo rewrite operation at the end of the data read-out cycle of memory with the voltage ($V_{cc}+\Delta V''$) which is higher than the source voltage $V_{cc}$. More specifically, voltage $V_w$ on the word lines as selected is boosted twice while one of the paired data line which is at higher level than the other is boosted to the level ($V_{cc}+\Delta V''$) before the output data signal $D_{out}$ can be obtained. Subsequently, the signal $\phi_2$ illustrated in FIG. 3 is set to the level $V_{cc}$, as the result of which the pulse signal $\phi_x$ for driving the word line becomes zero volts. The voltage $V_w$ on the selected word line is also lowered to zero volts from a level ($V_{cc}+\Delta V_1+\Delta V_2$). Then, the reading operation comes to an end. At that time, the capacitance of the memory cell in which high potential has been stored among the plural cells selected by the word line is isolated from the data line with the voltage ($V_{cc}+V''$) being stored in the capacitance.

In the writing operation of the memory, the driving of the word line, boosting of the data line and the rewrite of the memory cell at the higher potential level are effected in the similar manner as in the case of the read-out operation described above. However, it is determined by the input data signal $D_{in}$ whether only one memory cell selected by the row decoder is to be high level or low level. The storage potential of such externally selected memory cell is determined by the output voltage from the I/O control circuit which voltage can also be made higher than the source voltage $V_{cc}$.

Figure 5:
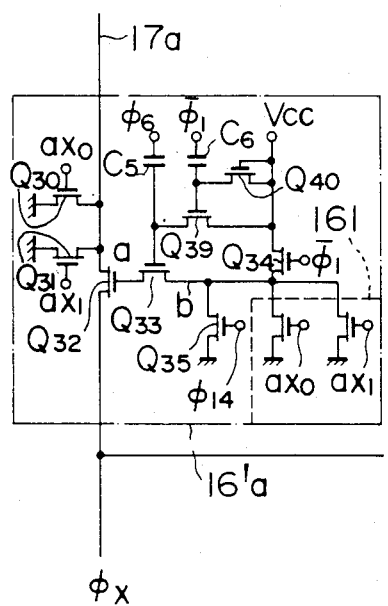
FIG. 5 shows a circuit diagram of a circuit which can be used in place of a circuit block 16a shown in FIG. 2.

In the memory described above, the $\phi_{xij}$-generator circuit 16a shown in FIG. 2 may be alternatively implemented in a circuit arrangement 16a' shown in FIG. 5. In the case of the $\phi_{xij}$-generator circuit 16a shown in FIG. 2, the pulse signal $\phi_6$ is applied to the gate of the MOS transistor $Q_{35}$ to thereby turn off the MOS transistor $Q_{32}$ after the pulse signal $\phi_x$ has been issued, whereby charge at the gate electrode of the MOS transistor $Q_{32}$ is discharged. In contrast, in the case of the circuit arrangement shown in FIG. 5, the discharging of the gate electrode of the MOS transistor $Q_{32}$ is effected by driving the gate of the MOS transistor $Q_{33}$ to thereby render both nodes a and b to be at a same potential.

More particularly, the nodes are pre-charged when the signal $\phi_1$ is at high level or $V_{cc}$. Before the signal $\phi_1$ becomes high, one end of a capacitance $C_6$ and the gate electrode of MOS transistor $Q_{39}$ are set at the level of ($V_{cc}-V_T$) through MOS transistor $Q_{40}$ where $V_T$ represents threshold voltage of the transistor $Q_{40}$. Since the signal $\phi_1$ becomes high in this state, voltage at the one end of the capacitance $C_6$ and the gate electrode of the MOS transistor $Q_{39}$ are rendered to be higher than $V_{cc}$ through the capacitance $C_6$. As the consequence, the gate electrode of the MOS transistor $Q_{33}$ and one end of a capacitance $C_5$ are pre-charged to the level of $V_{cc}$. The potential of the level $V_{cc}$ at the gate electrode of the MOS transistor $Q_{33}$ pre-charges the nodes a and b to the level of ($V_{cc}-V_T$) through the MOS transistor $Q_{34}$. On the other hand, souce and drain electrodes of the MOS transistor $Q_{32}$ are set to zero volts in response to the signal $\phi_2$. Subsequently, the signal $\phi_1$ becomes low or at zero volts. Assuming that the decoder 161 is now selected in response to the input address signal, the charge at the gate of the MOS transistor $Q_{32}$ of the $\phi_{xij}$-generator circuit 16a' still continues to be held. Subsequently, the signal $\phi_x$ is produced, whereby the word line voltage $V_w$ is rendered high, i.e. at the level $V_{cc}$ through the $\phi_{xij}$-generator circuit mentioned above. At that time, the node a of the $\phi_{xij}$-generator circuit 16' is bootstraped from the pre-charged level ($V_{cc}-V_T$) to a higher voltage through the MOS transistor $Q_{32}$ and the signal $\phi_x$. Meanwhile, the node b is pre-charged to the level of ($V_{cc}-V_T$). Since the gate potential of the MOS transistor $Q_{33}$ is at the level $V_{cc}$ and thus the MOS transistor $Q_{33}$ is in the conducting state, the boosting of the voltage level at the node a mentioned above brings about no variation in the potential at the node b. Thereafter, the signal $\phi_6$ becomes high (i.e. at the level $V_{cc}$). This signal $\phi_6$ of high level causes the gate potential of the MOS transistor $Q_{33}$ to be boosted from the level $V_{cc}$ to a higher voltage through the capacitance $C_5$. Thus, the node a is short-circuited to the node b through the MOS transistor $Q_{33}$, resulting in that the potential level at the node a is lowered to cause the MOS transistor $Q_{32}$ to be turned off.

Thereafter, when the signal $\phi_{14}$ becomes high (at the level $V_{cc}$), the nodes a and b are reset to zero volts through the MOS transistor $Q_{35}$.

In the circuit arrangement of the $\phi_{xij}$-generator shown in FIG. 5, the MOS transistor $Q_{32}$ can be turned off at a high speed, even when the gate voltage of the transistor $Q_{32}$ is increased through the bootstrap operation.

Figure 6:
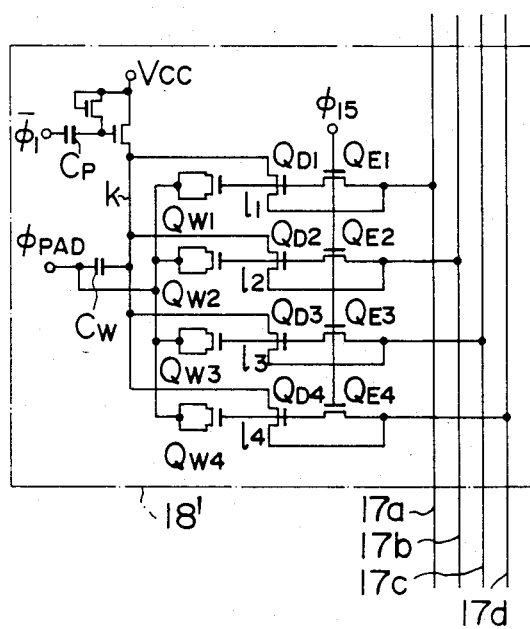
FIG. 6 shows a circuit diagram of a circuit which can be used in place of a circuit block 18 shown in FIG. 2.

FIG. 6 shows a booster circuit 18' which can be used in place of the booster circuit 18 shown in FIG. 2.

In the case of the booster circuit 18 shown in FIG. 2, the MOS capacitors are, respectively, connected to the pulse signal lines 17a, 17b, 17c and 17d. In contrast, in the case of the booster circuit 18' shown in FIG. 6, a single capacitance $C_w$ is provided in common to these pulse signal lines, wherein selected ones of the pulse signal lines are boosted through the bootstrap operations of this capacitance $C_w$. To this end, the capacitance $C_w$ is connected to the pulse signal lines 17a, 17b, 17c and 17d, respectively, through MOS transistors $Q_{D1}$, $Q_{D2}$, $Q_{D3}$ and $Q_{D4}$ which serve for selecting the pulse signal line to be boosted. These MOS transistors $Q_{D1}$, $Q_{D2}$, $Q_{D3}$ and $Q_{D4}$ have respective gate electrodes connected to those of MOS capacitors $Q_{w1}$, $Q_{w2}$, $Q_{w3}$ and $Q_{wn}$, respectively, and additionally connected to the pulse signal lines 17a, 17b, 17c and 17d, respectively, through MOS transistors $Q_{E1}$, $Q_{E2}$, $Q_{E3}$ and $Q_{E4}$ having gate electrodes supplied with a signal $\phi_{15}$ which is varied from the potential level $(V_{cc}+\Delta V')$ to $V_{cc}$ after the word line driving pulse signal $\phi_x$ has been issued. At first, the signal $\phi_1$ is applied to a capacitance $C_p$ to precharge a node k to the potential level of $V_{cc}$. At this time point, the pulse signal lines 17a, 17b, 17c and 17d are at low level with the MOS transistors $Q_{E1}$, $Q_{E2}$, $Q_{E3}$ and $Q_{E4}$ being in the conductive state. Thus, nodes $l_1$, $l_2$, $l_3$ and $l_4$ are also at low level or zero volts. Next, the word line driving signal $\phi_x$ is applied to one of the pulse signal lines 17a, 17b, 17c and 17d. For the convenience of description, it is assumed that the signal $\phi_x$ is applied to the pulse signal line 17a. On the condition, the node $l_1$ becomes high or at the level $V_{cc}$, while the other nodes $l_2$, $l_3$ and $l_4$ remain at low level or zero volts. Subsequently, the signal $\phi_{15}$ is varied from the level $(V_{cc}+\Delta V')$ to $V_{cc}$, which is followed by variation of the signal $\phi_{pad}$ from zero volts to the level $V_{cc}$. Then, among the MOS capacitors $Q_{w1}$, $Q_{w2}$, $Q_{w3}$ and $Q_{w4}$, only the MOS capacitor $Q_{w1}$ that has the gate electrode applied with the high potential becomes effective to perform the bootstrap operation for boosting the node $l_1$ from the level $V_{cc}$ to a higher level. At the same time, the potential at the node k is also caused to increase from the level $V_{cc}$ through the capacitance $C_w$. Since the control signal $\phi_{15}$ is lowered to the level $V_{cc}$ at that time, the MOS transistor $Q_{E1}$ is turned off. On the other hand, the boosting of the node $l_1$ causes the pulse signal line 17a to be boosted from $V_{cc}$ to $(V_{cc}+\Delta V_1)$ through the MOS transistor $Q_{D1}$. The other pulse signal lines 17b, 17c and 17d remain low, because the MOS transistors $Q_{D2}$, $Q_{D3}$, $Q_{D4}$ and $Q_{D5}$ remain turned off, i.e. in the non-conducting state.

In the exemplary embodiment described so far, the first boosting of the word lines potential is effected by means of the pulse signal lines 17 outgoing from the pulse distributor circuit 16, while the second boosting is effected by the word lines 23. In this connection, it should be mentioned that the first boosting can be effected on the input side of the pulse distributor circuit 16 with the second boosting being effected by the pulse signal lines 17. Then, the number of the booster circuits can be significantly decreased. In this case, however, it is necessary to effect the first boosting before the switching MOS transistor $Q_{32}$ is turned off.

Figure 7:
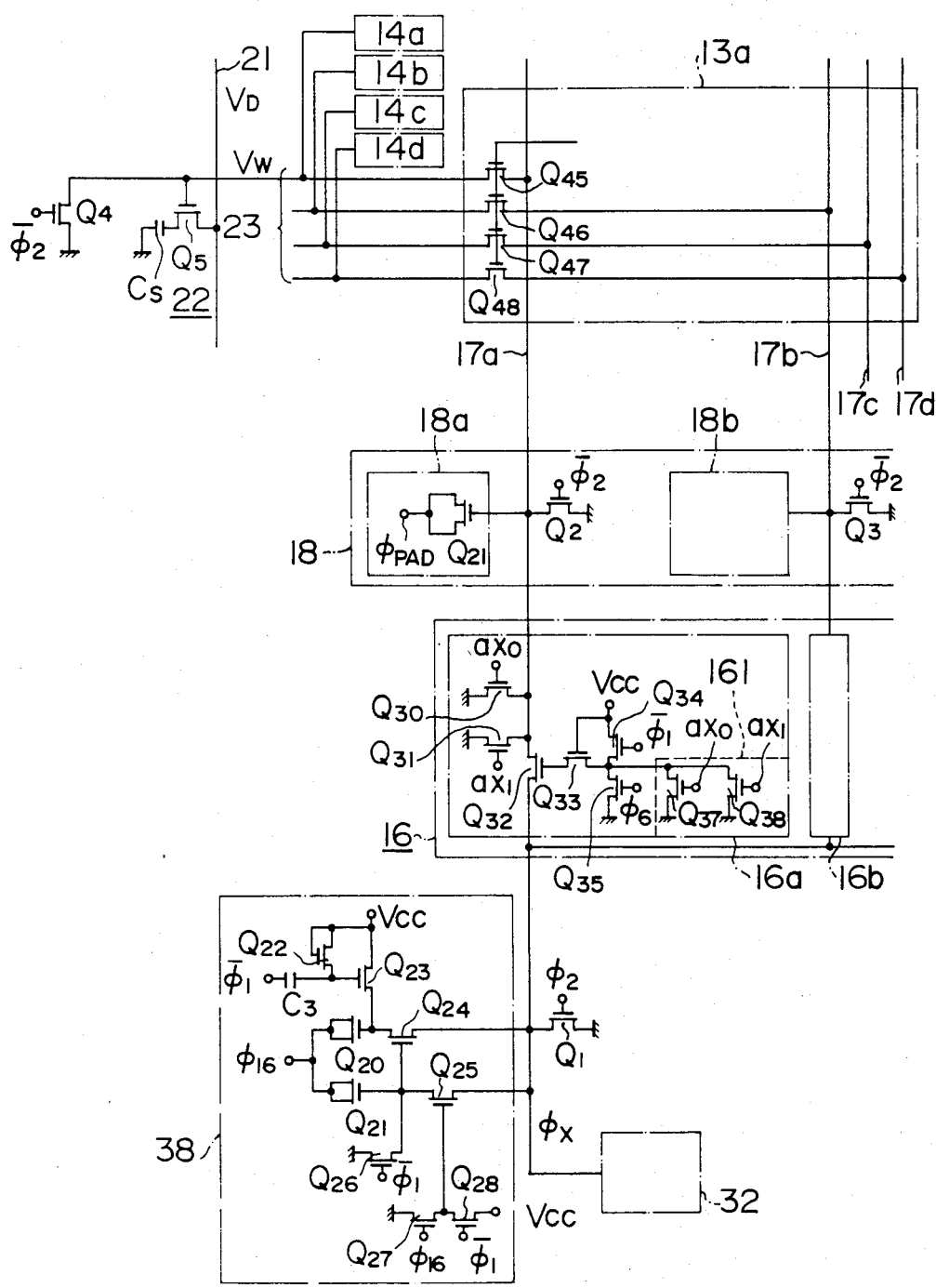
FIG. 7 shows in a circuit diagram a main portion of the dynamic semiconductor memory according to another embodiment of the invention.
Figure 8:
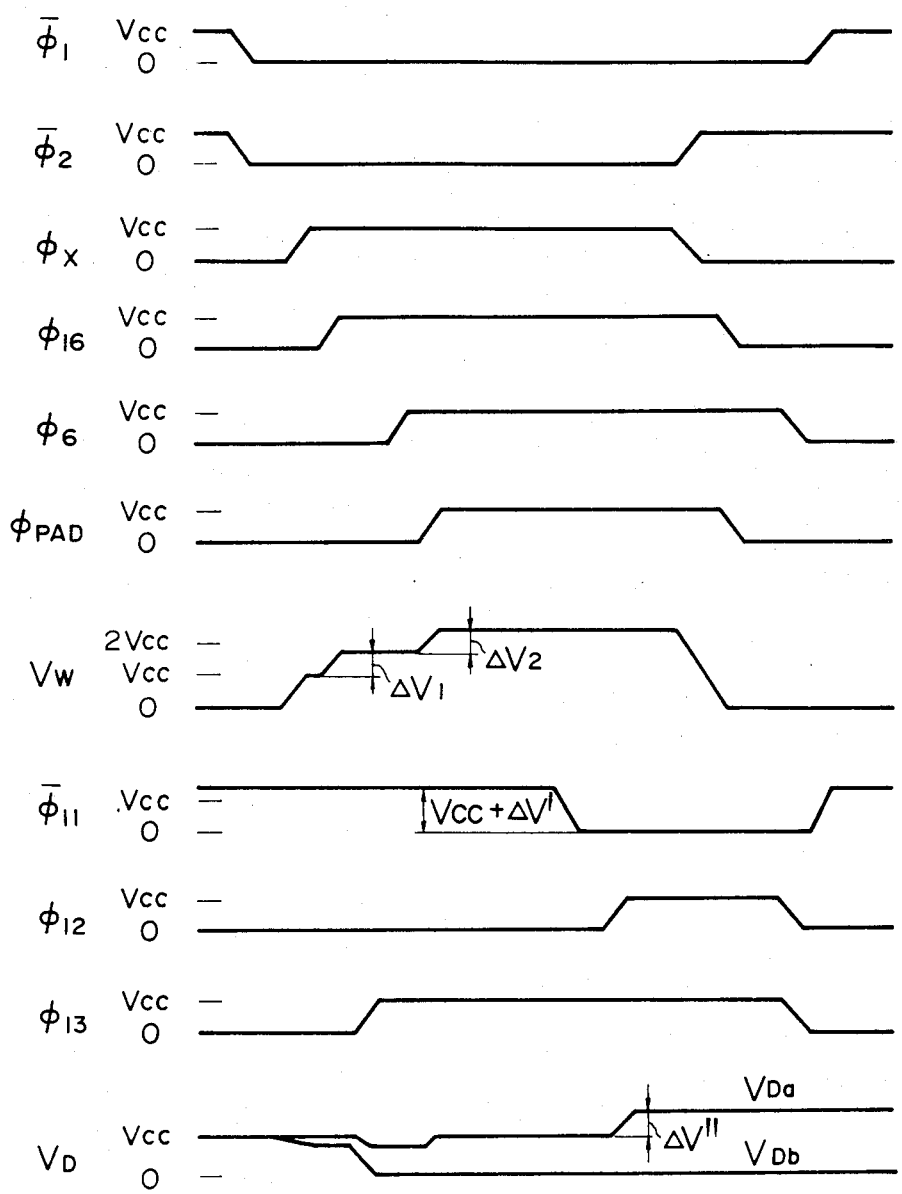
FIG. 8 shows a timing chart to illustrate operation of the memory circuit shown in FIG. 7.

FIG. 7 shows a circuit diagram of another exemplary embodiment of the memory realized on the principle mentioned above. Signal waveforms produced at various points or nodes of the circuit shown in FIG. 7 are illustrated in FIG. 8. The circuit arrangement shown in FIG. 7 differs from the one shown in FIG. 2 in that the booster circuits 28 connected to the individual word lines 23 are replaced by a booster circuit 38 which is disposed at the input side of the pulse distributor circuit 16 and which effects the boosting operation with the aid of the signal $\phi_{16}$. Operation of this booster circuit 38 will be elucidated below.

In the standby state of the memory according to this embodiment, a gate electrode of a MOS transistor $Q_{25}$ is charged to the level $(V_{cc}-V_T)$ through a MOS transistor $Q_{28}$ when the signal $\phi_1$ becomes high (i.e. at the level $V_{cc}$). Further, gate electrodes of a MOS transistor $Q_{24}$ and a MOS capacitor $Q_{21}$ as well as a drain electrode of the MOS transistor $Q_{25}$ are set at low level (i.e. at zero volts). On the other hand, since the signal $\phi_1$ is applied to a capacitance $C_3$, the gate potential of a MOS transistor $Q_{23}$ is boosted, resulting in that the gate of a MOS capacitor $Q_{20}$ and the drain electrode of the MOS transistor $Q_{24}$ are charged to the level $V_{cc}$. By the way, the source electrodes of the MOS transistors $Q_{24}$ and $Q_{25}$ are reset to the low level (i.e. zero volts) by the signal $\phi_2$ of high level $(V_{cc})$ in the standby state of the memory. It will thus be obvious that the MOS transistor $Q_{24}$ is in the non-conducting state while the MOS transistor $Q_{25}$ is in the conducting state. The booster circuit 38 is now in the standby state. On these conditions, when the signal $\phi_x$ rises up from the zero volt level to the level $V_{cc}$, this signal $\phi_x$ is transmitted to the selected one of the word lines 23 in the manner described hereinbefore. On the other hand, in the booster circuit 38, the gates of the MOS capacitor $Q_{21}$ and the MOS transistor $Q_{24}$ are concurrently charged to the level $(V_{cc}-V_T)$ through the MOS transistor $Q_{25}$. Thereafter, the signal $\phi_{16}$ is applied to source and drain electrodes of the MOS capacitors $Q_{20}$ and $Q_{21}$ as well as the gate electrode of MOS transistor $Q_{27}$, as described hereinbefore. At the same time, the signal $\phi_{16}$ causes the gate potential of the MOS transistor $Q_{25}$ to be set to the ground level to thereby turn off this transistor $Q_{25}$ and further causes the gate potential of the MOS transistor $Q_{24}$ to be boosted through the MOS capacitor $Q_{21}$, which transistor $Q_{24}$ has been charged at the level $(V_{cc}-V_T)$ by the signal $\phi_x$ and is now rendered to be more conductive. Since the signal $\phi_{16}$ is applied across the source and the drain electrodes of the MOS capacitor $Q_{20}$ in this state of the booster circuit 38, the signal $\phi_x$ is increased to a level higher than $V_{cc}$ through the MOS transistor $Q_{24}$.

When the first boosting of the word line potential is effected through the operation of the booster circuit 38 mentioned above, the signal $\phi_6$ becomes high to thereby turn off the MOS transistor $Q_{32}$ of the pulse distributor circuit. Subsequently, the signal $\phi_{pad}$ becomes high, whereby the second boosting of the word line potential is effected by means of the booster circuit 18.

By the way, in the booster circuit 38, the MOS transistor $Q_{24}$ is in the non-conducting state when the signal $\phi_x$ rises up from the zero volt level up to the level $V_{cc}$. Accordingly, at that time, the boosting MOS capacitor $Q_{20}$ presents no load capacitance to the timing control circuit 32, whereby the rise-up rate of the signal $\phi_x$ can be advantageously increased. If the booster circuits 18a, 18b and so forth are implemented in the same circuit configuration as that of the booster circuit 38 mentioned above, the rise-up rate or speed of the signal $\phi_x$ can be increased, which is, of course, advantageous.

In the exemplary embodiment of the memory shown in FIG. 7, potential at the selected one of the pulse signal lines 17a, 17b, 17c and 17d is thus boosted twice. When the word driver 13a is not selected, the MOS transistors $Q_{45}$, $Q_{46}$, $Q_{47}$ and $Q_{48}$ are in the non-conducting state. Thus, the boosted voltage is applied to these MOS transistors $Q_{45}$, $Q_{46}$, $Q_{47}$ and $Q_{48}$, which means that voltage withstanding capability of these transistors should be increased. However, when the channel lengths of these MOS transistors are lengthened to meet the above requirement, the driving capability of the word driver is undesirably degraded, involving a correspondingly increased access time, which is a disadvantage. In this connection, it should be noted that, in the case of the memory arrangement illustrated in FIG. 2, the voltage applied to the transistors $Q_{45}$, $Q_{46}$, $Q_{47}$ and $Q_{48}$ is relatively low, which means that the access time is correspondingly shortened, which is a significant advantage.

We claim:

1. A dynamic type semiconductor monolithic memory, comprising:
   a plurality of word lines;
   a plurality of data lines intersecting said word lines;
   a plurality of memory cells each disposed at crossovers formed by said intersecting word lines and data lines for storing a charge therein, wherein a magnitude of said stored charge is dependent on a voltage level of the data line corresponding to the word line which is driven;
   word line selecting means for selecting one of said word lines;
   word line driving means for driving said selected word line for a predetermined period by boosting said selected word line to a first increased level and then to a second increased level by two separate boosting operations after said selected word line has been set to a predetermined voltage;
   means for precharging said plurality of data lines to a precharged voltage during said predetermined period;
   sense amplifier means including means for discharging some data lines to a level lower than a predetermined level and for setting other data lines at a level higher than said predetermined level during said predetermined period; and
   voltage compensating means coupled to said data lines for increasing to a level higher than the precharged voltage a potential on those data lines whose potential has been set by said sense amplifier means to be higher than said predetermined level during said predetermined period.

2. A dynamic type semiconductor monolithic memory according to claim 1, wherein said voltage compensating means includes means for selecting the data line at the voltage not lower than said predetermined level; means for restoring the voltage of the selected data line to said pre-charged voltage; and means for increasing the voltage of the data line restored to said pre-charged voltage to a level higher than said pre-charged voltage.

3. A dynamic type semiconductor monolithic memory, comprising:
   a plurality of word lines;
   a plurality of data lines intersecting said word lines;
   a plurality of memory cells each disposed at crossovers formed by said intersecting word lines and data lines for storing a charge therein, wherein a magnitude of said stored charges is dependent on a voltage level of the data line corresponding to the word line which is driven;
   word line selecting means including first switching means for connecting a driving pulse signal to one of plural pulse signal lines and second switching means for connecting said one pulse signal line to one of said plural word lines;
   word line driving means for driving said selected word line for a predetermined period by boosting said selected word line to a first increased level and then to a second increased level by two separate boosting operations after said selected word line has been set to a predetermined voltage;
   means for precharging said plurality of data lines to a precharged voltage during said predetermined period;
   sense amplifier means including means for discharging some data lines to a level lower than a predetermined level and for setting other data lines at a level higher than said predetermined level during said predetermined period; and
   voltage compensating means coupled to said data lines for increasing to a level higher than the precharged voltage a potential on those data lines whose potential has been set by said sense amplifier means to be higher than said predetermined level during said predetermined period.

4. A dynamic type semiconductor monolithic memory according to claim 3, wherein said word line driving means includes a pulse generator for producing the driving pulse signal having an amplitude not larger than that of a source voltage, first booster means which is operated after generation of said driving pulse signal, and second booster means which is operated after said first booster means has been operated.

5. A dynamic type semiconductor monolithic memory according to claim 4, wherein at least one of said first and second switching means is interposed between said first and second booster means.

6. A dynamic type semiconductor monolithic memory according to claim 4, wherein said first booster means is connected to said plural pulse signal lines, while said second booster means is connected to said plural word lines.

7. A dynamic type semiconductor monolithic memory according to claim 6, wherein said first booster means is operated after said first switching means is turned off.

8. A dynamic type semiconductor monolithic memory according to claim 7, wherein said second booster means is operated after said second switching means is turned off.

9. A dynamic type semiconductor monolithic memory according to claim 6, wherein said first booster means includes non-linear capacitances having first ends connected to said plural pulse signal lines and second ends applied with a predetermined pulse voltage, and presenting effective capacities when voltage of said pulse signal lines is higher than a predetermined level.

10. A dynamic type semiconductor monolithic memory according to claim 9, wherein said non-linear capacitances are constituted by n-channel MOS capacitors having gate electrodes connected to said pulse signal lines, respectively.

11. A dynamic type semiconductor monolithic memory according to claim 6, wherein said second booster means includes non-linear capacitances having first ends connected to said plural pulse signal lines and second ends applied with a predetermined pulse voltage and presenting effective capacities when voltage of said pulse lines is higher than a predetermined level.

12. A dynamic type semiconductor monolithic memory according to claim 11, wherein said non-linear capacitances are constituted by n-channel MOS capacitors having gate electrodes connected to said pulse signal lines, respectively.

13. A dynamic type semiconductor monolithic memory according to claim 6, wherein said first booster means is provided in common to said plurality of the pulse signal lines, and includes a capacitance to which a predetermined pulse voltage is applied and third switching means for connecting said capacitance to the only word line of said plural word lines that is at a voltage not lower than the predetermined level.

14. A dynamic type semiconductor monolithic memory according to claim 13, wherein said third switching means includes MOS transistors for connecting said capacitance to said plural pulse signal lines, respectively, and a plurality of n-channel MOS capacitors having first ends connected to gate electrodes of said MOS transistors, respectively, and second ends to which said pulse voltage is applied, and switch means for connecting said word lines to the gate electrodes of said MOS transistors, respectively, and isolating said word lines and said MOS transistors from each other before said pulse voltage is produced.

15. A dynamic type semiconductor monolithic memory comprising:
   a plurality of word lines;
   a plurality of data lines intersecting said word lines;
   a plurality of memory cells which are respectively disposed at points of intersection between said word lines and said data lines, wherein each of the memory cells includes
      (a) a capacitor means for storing electric charges, and
      (b) a switch means for connecting said capacitor means to a corresponding data line in response to a signal which is on a corresponding word line;
   word line selecting means for selecting one of said word lines;
   word line driving means for driving said selected word line during a predetermined period, wherein the driving means includes
      (a) a first boost circuit for increasing a potential on said selected word line in response to a first pulse after said selected word line has been set to a predetermined potential,
      (b) means for stopping current flowing from said selected word line into said first boost circuit, and
      (c) a second boost circuit for increasing a potential on said selected word line in response to a second pulse which is generated after the first pulse; and
   a third boost circuit for increasing a potential on data lines whose potential is higher than a predetermined level during said predetermined period.

16. A dynamic type semiconductor monolithic memory comprising:
   a plurality of word lines;
   a plurality of data lines intersecting said word lines;
   a plurality of memory cells which are respectively disposed at points of intersection between said word lines and said data lines, wherein each of the memory cells includes
      (a) a capacitor means for storing electric charges, and
      (b) a first switch means for connecting said capacitor means to a corresponding data line in response to a signal which is on a corresponding word line;
   word line selecting means including second switching means for selecting one of plural pulse signal lines and third switching means for connecting said one pulse signal line to one of said plural word lines;
   word line driving means for driving said selected word line during a predetermined period, wherein the driving means includes
      (a) a first boost circuit for increasing a potential on said selected word line in response to a first pulse after said selected one has been set to a predetermined potential,
      (b) means for stopping electric charges flowing from said selected word line into said first boost circuit, and
      (c) a second boost circuit for increasing said potential on said selected word line in response to a second pulse which is generated after the first pulse; and
   a third boost circuit for increasing a potential on data lines whose potentials are higher than a predetermined level during said predetermined period.

17. A dynamic type semiconductor monolithic memory according to claim 16, wherein at least one of said second and third switching means is interposed between said first and second boost circuits, and said interposed switching means is turned off by said stopping means.

18. A dynamic type semiconductor monolithic memory according to claim 15, wherein said voltage compensating means includes means for selecting the data line at the voltage not lower than said predetermined level; means for restoring the voltage of the selected data line to a precharged voltage; and means for increasing the voltage of the data line restored to said precharged voltage to a level higher than said precharged voltage.

19. A dynamic type semiconductor monolithic memory according to claim 16, wherein said first booster means is connected to said plural pulse signal lines, while said second booster means is connected to said plural word lines.

20. A dynamic type semiconductor monolithic memory according to claim 19, wherein said first booster means is operated after said first switching means is turned off.

21. A dynamic type semiconductor monolithic memory according to claim 20, wherein said second booster means is operated after said second switching means is turned off.

22. A dynamic type semiconductor monolithic memory according to claim 19, wherein said first booster means includes non-linear capacitances having first ends connected to said plural pulse signal lines and second ends applied with a predetermined pulse voltage, and presenting effective capacities when voltage of said pulse signal lines is higher than a predetermined level.

23. A dynamic type semiconductor monolithic memory according to claim 22, wherein said non-linear capacitances are constituted by n-channel MOS capacitors having gate electrodes connected to said pulse signal lines, respectively.

24. A dynamic type semiconductor monolithic memory according to claim 19, wherein said second booster means includes non-linear capacitances having first ends connected to said plural pulse signal lines and second ends applied with a predetermined pulse voltage and presenting effective capacities when voltage of said pulse lines is higher than a predetermined level.

25. A dynamic type semiconductor monolithic memory according to claim 24, wherein said non-linear capacitances are constituted by n-channel MOS capacitors having gate electrodes connected to said pulse signal lines, respectively.

26. A dynamic type semiconductor monolithic memory according to claim 19, wherein said first booster means is provided in common to said plurality of the pulse signal lines, and includes a capacitance to which a predetermined pulse voltage is applied and third switching means for connecting said capacitance to the only word line of said plural word lines that is at a voltage not lower than the predetermined level.

27. A dynamic type semiconductor monolithic memory according to claim 26, wherein said third switching means includes MOS transistors for connecting said capacitance to said plural pulse signal lines, respectively, and a plurality of n-channel MOS capacitors having first ends connected to gate electrodes of said MOS transistors, respectively, and second ends to which said pulse voltage is applied, and switch means for connecting said word lines to the gate electrodes of said MOS transistors, respectively, and isolating said word lines and said MOS transistors from each other before said pulse voltage is produced.

* * * * *